United States Patent
Vassiliev et al.

(10) Patent No.: US 6,180,490 B1
(45) Date of Patent: Jan. 30, 2001

(54) METHOD OF FILLING SHALLOW TRENCHES

(75) Inventors: Vladislav Vassiliev; Igor Peidous, both of Singapore (SG)

(73) Assignee: Chartered Semiconductor Manufacturing Ltd., Singapore (SG)

(*) Notice: Under 35 U.S.C. 154(b), the term of this patent shall be extended for 0 days.

(21) Appl. No.: 09/318,670

(22) Filed: May 25, 1999

(51) Int. Cl.[7] .................................................. H01L 21/76
(52) U.S. Cl. ......................... 438/424; 438/437; 438/692
(58) Field of Search ................................... 438/426, 296, 438/424, 425, 431, 700, 435, 437, 692, 697

(56) References Cited

U.S. PATENT DOCUMENTS

| | | | |
|---|---|---|---|
| 5,447,884 | 9/1995 | Fahey et al. | 437/67 |
| 5,726,090 | 3/1998 | Jang et al. | 438/435 |
| 5,741,740 | 4/1998 | Jang et al. | 438/435 |
| 5,786,262 | 7/1998 | Jang et al. | 438/424 |
| 5,801,083 | 9/1998 | Yu et al. | 438/424 |
| 5,930,645 | * 7/1999 | Lyons et al. | 438/424 |
| 5,960,297 | * 9/1999 | Saki | 438/424 |
| 5,989,977 | * 11/1999 | Wu | 438/431 |

* cited by examiner

Primary Examiner—David Nelms
Assistant Examiner—Phuc T. Dang
(74) Attorney, Agent, or Firm—George O. Saile; Rosemary L. S. Pike

(57) ABSTRACT

This invention relates to a method of fabrication used for semiconductor integrated circuit devices, and more specifically to an improved method of filling shallow trenches, in shallow trench isolation, STI sub-quarter micron technology. The present method relates to a process for forming trench gap filling with chemically vapor deposited (CVD) silicon dioxide layers within trenches within substrates employed in integrated circuit fabrication.

There is first provided a silicon substrate having a trench formed therein. There is then formed a silicon dioxide layer through tetraethylorthosilicate (TEOS) and ozone reaction, at either sub-atmospheric, or atmospheric pressure, with enhanced surface sensitivity features, which lines the trench providing corner rounding. Then there is a thermal oxidation to form within the trench a thermal silicon dioxide layer underneath the TEOS-ozone trench silicon dioxide liner. Finally, there is formed on top of the trench a silicon dioxide layer formed by either low pressure CVD using TEOS, or non-surface sensitive TEOS ozone CVD, or a high-density plasma CVD process. All layers are further annealed to form a void-free trench fill.

11 Claims, 3 Drawing Sheets

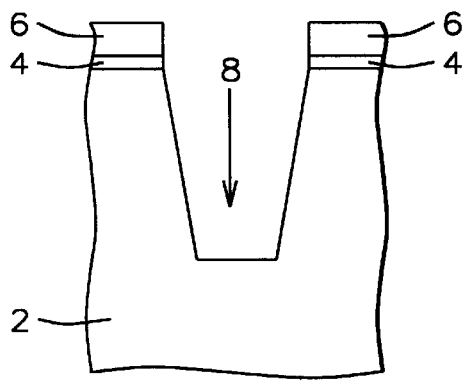
FIG. 1a – Prior Art
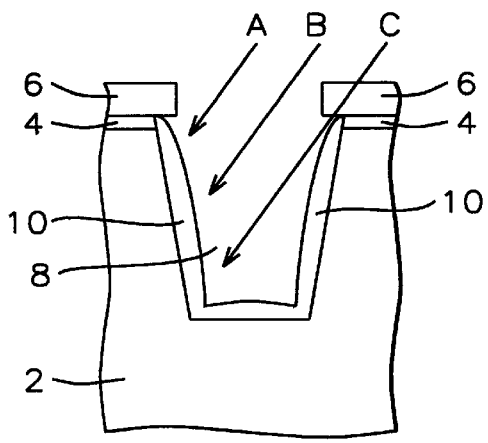
FIG. 1b – Prior Art
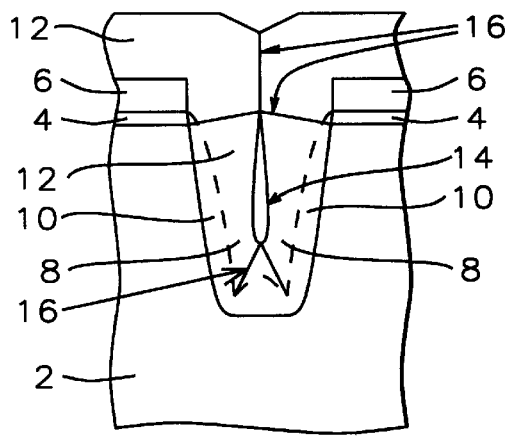
FIG. 1c – Prior Art
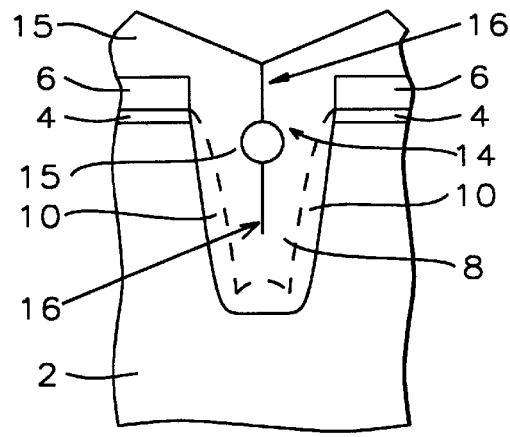
FIG. 1d – Prior Art

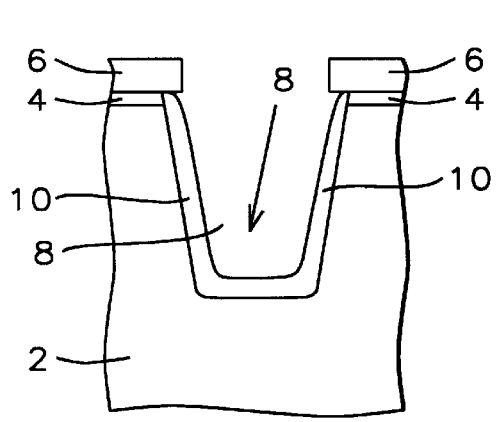
FIG. 2
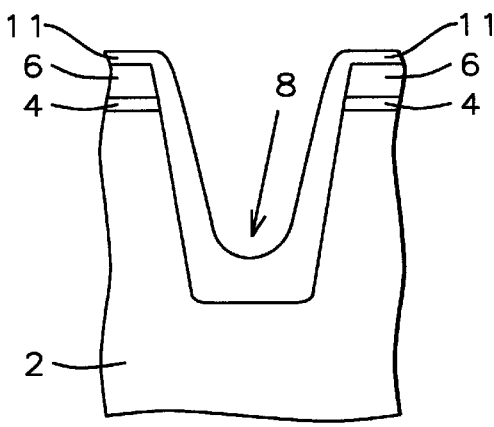
FIG. 3
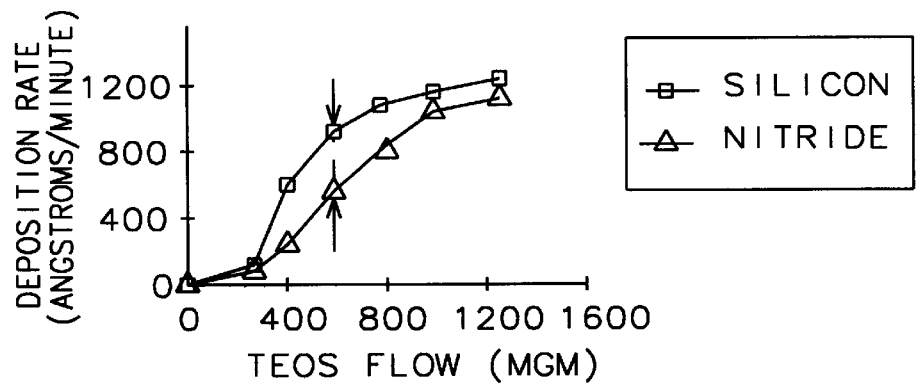
FIG. 4a
| Table 1. SACVD oxide properties | | |
|---|---|---|
| Properties | On Si | On SiN |
| Roughness | Low | High |
| WERR | 5.7 | 6.6 |
| Shrinkage | ~4% | ~6% |
FIG. 4b

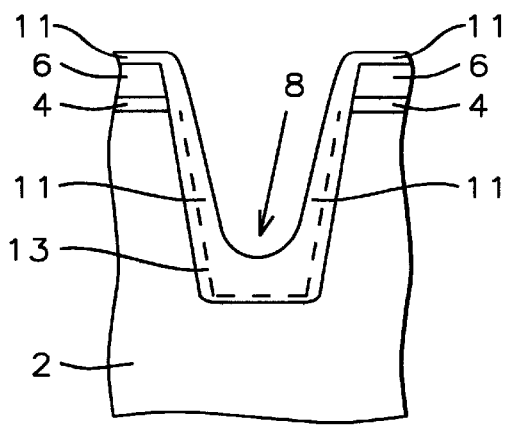
FIG. 5
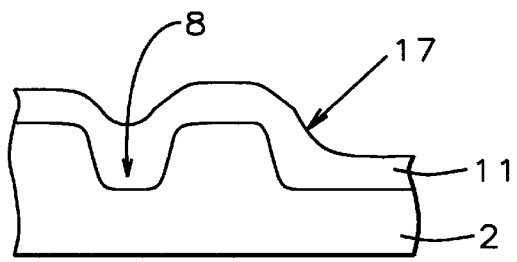
FIG. 6
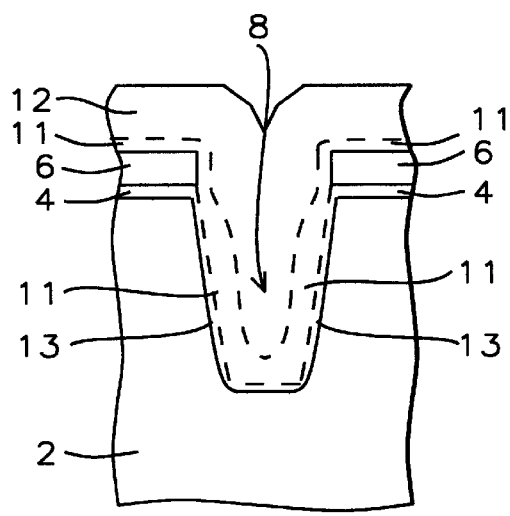 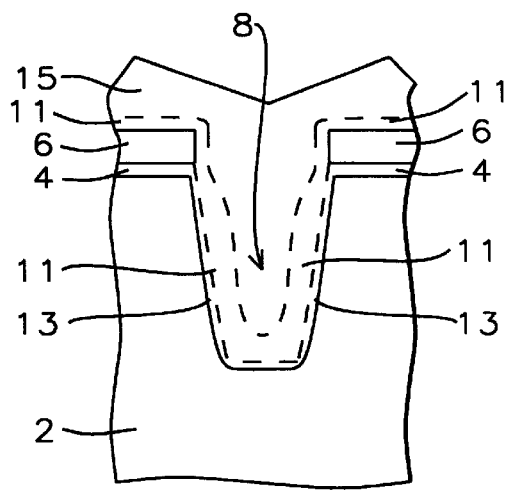
FIG. 7a   FIG. 7b

METHOD OF FILLING SHALLOW TRENCHES

BACKGROUND OF THE INVENTION (1) Field of the Invention

This invention relates to a method of fabrication used for semiconductor integrated circuit devices, and more specifically to a method of filling shallow trenches, in shallow trench isolation, STI sub-quarter micron technology. The present method relates to a method for forming of void-free trench gap fill with chemically vapor deposited (CVD) silicon oxide films using a layer of silicon dioxide liner deposited from a TEOS-ozone mixture at atmospheric pressure chemical vapor deposition (APCVD) or at sub-atmospheric pressure thermal chemical vapor deposition (SACVD) conditions, within trenches within substrates employed in integrated circuit fabrication.

(2) Description of Prior Art

Integrated circuits are formed from semiconductor substrates within and upon whose surfaces are formed resistors, transistors, diodes and other electrical circuit elements. The electrical circuits elements are connected internally and externally to the semiconductor substrate upon which they are formed through patterned conductor layers which are separated by dielectric layers.

As integrated circuit device technology has advanced and integrated circuit device dimensions have decreased, it has become increasingly common within advanced integrated circuits to employ trench isolation methods such as shallow trench isolation (STI) methods and recessed silicon dioxide isolation (ROI) methods to form trench isolation regions nominally coplanar with adjoining active semiconductor regions of semiconductor substrates. Such trench isolation methods typically employ a chemical mechanical polish (CMP) planarizing method to provide a nominally planarized surface to a trench isolation region formed from a trench fill dielectric layer formed within the trench. There are some process problems in the prior art associated with shallow trench isolation (STI) and the integration of trench filling by silicon dioxide films.

Process problems that arise under certain conditions are the formation of voids and seams in the isolating dielectrics employed in the trench fill process. One reason for the void and seam formation is shown as prior art, sketched in sequence in FIGS. 1a to 1d. A semiconductor substrate 2 is shown; a layer of pad thermal silicon dioxide 4 has been grown on the surface of the substrate 2 and a layer of pad silicon nitride 6 has been deposited over the layer of pad thermal silicon dioxide. A trench 8 has been etched through the silicon nitride 6 and pad silicon dioxide 4 films and partially into the substrate 2, followed by thermal silicon dioxide 10 growth inside the trench 8. An isolation dielectric such as silicon dioxide is deposited over the silicon wafer to fill the STI trench either using chemical vapor deposition (CVD) technique, such as low pressure TEOS (tetraethylorthosilicate) (LPCVD), or TEOS-ozone atmospheric pressure (APCVD), or sub-atmospheric pressure (SACVD), as shown in FIG. 1c (12), or high-density plasma CVD (HDP-CVD), as shown in FIG. 1d (15).

Problems arise as shown in FIG. 1b: a) imperfect regions A (sharp edges) after thermal oxidation where thermal silicon dioxide 10 meets the pad silicon dioxide 4 and silicon nitride pad 6, b) imperfect regions B (high sidewall angles) after thermal oxidation where thermal silicon dioxide 10 forms the side of the trench, c) imperfect regions C (sharp edges) after thermal oxidation where thermal silicon dioxide 10 meets the lower portion of the trench.

As can be seen in FIG. 1c and FIG. 1d, seams 16 and voids 14 have formed in the isolation silicon dioxide dielectric, which fills the trench. The likelihood of these voids and seams forming increases as the aspect ratio of the trench increases. The aspect ratio is the ratio between the depth of the trench and the width of the trench. It is observed in the art that voids will form in the isolation dielectrics if the aspect ratio is greater than about 1:1 for low pressure TEOS LPCVD silicon dioxide, and about 2:1 for TEOS-ozone APCVD or SACVD, as well as, for high-density plasma CVD silicon dioxide. Unfortunately, aspect ratios exceeding 2:1, and even approaching 4:1, and higher are needed, as integrated circuit device geometry continues to decrease. Moreover, the problem of trench filling increases with further increases in the slope of the trench sidewall, along with the decrease of trench size. Furthermore, if voids formation occurs, then the surface conductive layers, which are subsequently deposited can get trapped in the voids, leaving a conductive, deleterious residue behind. These trapped conductive residues can then cause electrical shorting paths between layer elements, that are designed to be electrically isolated.

Related patents follow, which teach various methods of shallow trench isolation (STI).

U.S. Pat. No. 5,740,740 entitled "Shallow Trench Isolation (STI) Method Employing Gap Filling Silicon Oxide Dielectric Layer" granted Apr. 21, 1998 to Jang et al describes a method for filling a trench within a silicon substrate. Several process steps are employed to fill the trench: a) a thermal silicon oxide trench liner layer, b) an intermediate layer formed through plasma enhanced chemical vapor deposition (PECVD), which is used to suppress surface sensitivity affects, employing silane silicon source material, c) a gap filling silicon dioxide trench fill layer through an ozone assisted sub-atmospheric pressure thermal chemical vapor deposition (SACVD) employing, tetra-ethyl-ortho-silicate (TEOS).

U.S. Pat. No. 5,801,083 entitled "Use of Polymer Spacers for the Fabrication of Shallow Trench Isolation Regions with Rounded Top Corners" granted Sep. 1, 1998 to Yu et al describes a method for filling shallow trench isolation (STI) regions, with rounded corners. The process features the use of a polymer coated opening, in an insulator layer, used as a mask to define the shallow trench region in silicon. The sharp corner, at the intersection between the shallow trench and the unreacted region of semiconductor, is converted to a rounded corner, via thermal oxidation of exposed silicon surfaces. The polymer spacers also eliminate the top corner "wrap-around".

U.S. Pat. No. 5,447,884 entitled "Shallow Trench Isolation with Thin Nitride Liner" granted Sep. 5, 1995 to Fahey et al shows a method of forming shallow trench isolation (STI) with a silicon nitride liner layer of less than 5 nm in thickness. A densification step of a pyrogenic oxide anneal at 800 degrees Centigrade drives out impurities and densities the material.

U.S. Pat. No. 5,726,090 entitled "Gap-filling of $O_3$-TEOS for Shallow Trench Isolation" granted Mar. 10,1998 to Jang et al shows a method of gap filling shallow isolation with TEOS-ozone silicon dioxide. Trenches are formed and a thermal oxide layer is grown within the isolation trenches. A plasma enhanced silane-based silicon dioxide layer is deposited over thermal silicon dioxide layer within the isolation trenches and treated with nitrogen gas plasma. Thereafter, a TEOS-ozone tetra-ethyl-ortho-silicate silicon dioxide layer is deposited overlying the plasma enchanced silicon dioxide, which is used for both the suppression of the surface sensitivity affects and for filling the isolation trenches. The excess TEOS-ozone deposited layer and the plasma enhanced silicon dioxide layer are polished away.

U.S. Pat. No. 5,786,262 entitled "Self-Planarized Gap filling for Shallow Trench Isolation" granted Jul. 28, 1998 to Jang et al describes a method to form a shallow trench isolation (STI) with a TEOS-ozone tetra-ethyl-ortho-silicate silicon dioxide, as a gap filling material. After the trench is formed, a TEOS-ozone silicon dioxide layer is formed in the shallow trench. Next, chemical mechanical polish (CMP) is performed to make the surface of the substrate planar. This is then followed by a thermal anneal to densify the remaining TEOS-ozone silicon dioxide layer.

SUMMARY OF THE INVENTION

It is general object of the present invention to provide an improved method of fabricating semiconductor integrated circuit devices, specifically by describing an improved process method of filling shallow trenches, in shallow trench isolation, STI sub-quarter micron technology.

The present invention starts shallow trench isolation (STI) with the conventional trench formation process, as provided and described in more detail in "DESCRIPTION OF THE PREFERRED EMBODIMENTS" section. The trench formation is processed in the usual manner: using oxidation for pad silicon dioxide layer, chemical vapor deposition for silicon nitride pad layer, photolithography and plasma etching for trench formation. The improved process of this present invention starts with a special lining of the trench. A thin layer of silicon dioxide, which is used as a liner material, is deposited by TEOS-ozone chemical vapor deposition process, using either atmospheric pressure (APCVD) or sub-atmospheric pressure (SACVD) chemical vapor deposition conditions. The smooth contours of the TEOS-ozone silicon dioxide film inside the trench are the result of several factors related to the specific TEOS-ozone deposition conditions and features. Hence, the silicon dioxide deposition rate for a particular sub-atmospheric deposition conditions versus the flow of TEOS, tetraethylorthosilicate, is performed at maximum difference in the rate of film deposition on silicon versus that on silicon nitride.

This TEOS-ozone deposition feature, namely different deposition characteristics on different surfaces, is known as a surface sensitivity effect. This effect can be enhanced up to four times comparing film deposition rate on silicon with that of silicon nitride, by an optimizing of the deposition characteristics, such as, TEOS flow rate, process temperature, process pressure, and ozone concentration in the reaction mixture. The surface sensitivity effect causes different silicon dioxide properties on silicon and nitride surfaces, and this effect is used to advantage in the present invention. Preferred film properties for a special set of SACVD deposition conditions are achieved with this invention and are described in detail further on.

Due to the common character of the deposition kinetics in the TEOS-ozone mixture, above mentioned differences in silicon dioxide film properties, are similar for both TEOS-ozone atmospheric pressure and sub-atmospheric pressure conditions. However, in both cases, one is operating in the zone where the differences in the deposition rates on silicon and nitride surfaces are at the maximum surface sensitivity effect.

The following desirable film properties are achieved with this invention: low TEOS-ozone silicon dioxide film roughness, relatively low wet etch rate ratio (compared to that of thermal silicon dioxide), and low film shrinkage of films, are achieved when the film is deposited directly on silicon, compared with TEOS-ozone films deposited directly on silicon nitride. TEOS-ozone film growth properties and its gap-fill capability are superior and normally they are characterized as a "flow-like" type of deposition, as indicated by actual scanning electron microscopy (SEM) micrographs (not shown in Figs.). The special deposition conditions of TEOS-ozone layer assume that the silicon dioxide film thickness should be approximately from 100 to about 500 Angstroms. A high rate of deposition for the silicon dioxide film should be employed, approximately 900 Angstrom per minute on a silicon substrate, and the ratio of deposition rate on silicon versus that of silicon nitride should be approximately 2 to 1.

Next in the process is the growth of a thin thermal silicon dioxide layer, which is grown on the silicon surface through the smooth TEOS-ozone silicon dioxide liner layer and forms a thermal silicon dioxide layer underneath the smooth TEOS-ozone silicon dioxide film. This said thermal oxide layer provides a good boundary layer between the silicon and dielectric material in the trench.

Next in the present invention is the process or method of deposition for the trench filling. Either conventional LPCVD, low pressure TEOS (tetraethylorthosilicate) chemical vapor deposited silicon dioxide or conventional non-surface sensitive TEOS-ozone CVD processes can be used. Another option to fill a trench is HDP-CVD, high-density plasma chemical vapor deposition using silane oxidation chemistry.

Finally in the process, all the layers are annealed with the end result being that all oxide layers are densified to achieve dense film inside the trench with satisfactory fill factor. The end result of this method is to achieve void-free trench fill.

Following the procedures of the STI preparation, a conventional processing sequence is followed, i.e., chemical mechanical polishing (CMP) for planarization, nitride layer removal, and so forth, for conventional processing.

BRIEF DESCRIPTION OF THE DRAWINGS

The object and other advantages of this invention are best described in the description of the preferred embodiments with reference to the attached drawings that include:

In FIG. 1a, FIG. 1b, FIG. 1c, and FIG. 1d, shown in cross-sectional representation, are illustrated the prior art methods of forming STI, shallow trench isolation.

FIG. 1a is the starting point for both prior art and the present invention.

In FIG. 1b is sketched some of the pitfalls of the conventional method of filling the trench.

In FIG. 1c a cross-sectional view is sketched showing the typical large void and seams that arise from prior art methods of trench fill processing, with low pressure TEOS silicon dioxide CVD or non-surface sensitive TEOS-ozone silicon dioxide CVD.

In FIG. 1d, a SEM cross-sectional view is sketched showing the void and seams that arise from prior art methods of trench fill processing with high-density plasma CVD silicon dioxide film.

FIG. 1a is the basic trench and is the starting point for this invention.

FIG. 2 shows certain ideal profiles of the trench before low pressure TEOS (tetraethylorthosilicate) CVD, or TEOS-ozone CVD silicon dioxide, or high-density plasma CVD.

FIG. 3 illustrates in cross-section the smooth contours of the TEOS-ozone film after chemical vapor deposition using the surface sensitive features of TEOS-ozone reaction, utilized in the present invention.

In FIG. 4a, a graph of deposition rate versus TEOS gas flow rate is presented with data for silicon dioxide deposition rate on both silicon and silicon nitride surfaces at certain particular TEOS-ozone sub-atmospheric pressure deposition conditions.

FIG. 4b lists the desired properties of TEOS-ozone CVD silicon dioxide film on the silicon surface, as compared to that of silicon nitride surface, achieved using surface sensitivity effect, such as: low surface roughness, low wet etch rate ratio (indicative of density and its opposite porosity), and low film shrinkage.

FIG. 5 illustrates in cross-section the smooth film contours of the present invention and combines the TEOS-ozone silicon dioxide layer with the thermal silicon dioxide underneath.

FIG. 6 shows in cross-section the "flow-like" TEOS-ozone chemical vapor deposition type with smooth film contours and the present invention's good fill factor for a STI, shallow trench isolation structure.

FIG. 7a shows the cross-section of structures filled with LPCVD or TEOS-ozone CVD silicon dioxide films after following a densification step, resulting in void-free STI structures in accordance with the present invention.

FIG. 7b represents a densified trench filled with HDP-CVD silicon dioxide films, as a trench-filling dielectric material.

DESCRIPTIONS OF THE PREFERRED EMBODIMENTS

As background to the present invention, a conventional method of fabricating shallow trench isolation (STI) is illustrated as Prior Art in cross-sectional sketches in FIGS. 1a, 1b, 1c, and 1d. As shown in FIG. 1a, the semiconductor substrate 2 is the base starting material for the trench structures. A thermal silicon dioxide pad oxide layer 4 is grown on the silicon substrate, as depicted in FIG. 1a. The thermally grown silicon dioxide pad is grown specifically at a temperature of approximately 1050° C. using an oxygen gas ambient. The thermally grown silicon dioxide pad film thickness is from about 100 to 200 Angstroms. Then a chemically vapor deposited (CVD) silicon nitride layer, pad nitride 6, is deposited on top of the pad silicon dioxide, shown in FIG. 1a. The pad silicon nitride film is deposited, using low pressure chemical vapor deposition (LPCVD ) with the following specific reactor conditions: temperature 700° C., pressure 0.3 Torr, and ratio of ammonia to dichlorosilane of 10 to 1, for a targeted thickness from about 1,500 to 2,200 Angstroms.

Conventional quarter or sub-quarter micron lithographic processes (for example, a 0.25 μm process) are performed to define the trench areas. Plasma directional etching is performed to etch the trench. The end result is the formation of trenches 8 that are shaped, as shown in FIG. 1a, which is a starting point for the present invention. Conditions of lithographic step are chosen in accordance with particular device needs and, specifically, can be as follows: 248 nm UV wavelength for an exposure time of approximately 15 seconds for "SEPR 431" photoresist type.

Dry etch of pad silicon nitride and silicon dioxide films is performed, specifically, at the following chamber conditions: pressure 40 milli-Torr, power 1400 Watts, $CF_4$ gas flow 90 sccm, $CHF_3$ gas flow 10 sccm, Ar gas flow 300 sccm, with a selected etch time for nitride thickness from about 1,500 to 2,000 Angstroms. A selectivity of the nitride to pad dioxide etch is chosen to be about 1:1 ratio and that of nitride to silicon etch is chosen to be about 2.5:1 ratio. Trench etch is performed using "TCP9400SE" reactor by Lam Research Inc., in a two step etch process under the following basic conditions: for first step in the etch process, pressure 10 milli-Torr, $CF_4$ gas flow 50 sccm, He gas flow 100 sccm, top power 300 Watts, bottom power 150 Watts. For the second step in the etch process, conditions are: pressure 20 milli-Torr, $Cl_2$ flow 35 sccm, $O_2$ flow 10 sccm, HBr flow 100 sccm, top power 405 Watts, bottom power 180 Watt. The etch time for both steps is chosen based on the particular device needs and the etch steps can be maintained in the range of about 8 to 15 seconds for the first etch step and about 60 to 150 seconds for the second etch step.

Briefly reviewing the problem areas of STI, which the present invention addresses and solves, are shown as Prior Art in FIGS. 1b, 1c, and 1d. However, as sketched in FIG. 5, the process method of the present invention is to deposit a thin trench liner film of silicon dioxide using surface sensitive TEOS-ozone deposition conditions, at atmospheric or sub-atmospheric pressure (APCVD or SACVD). This trench liner film is followed by a layer of thermal silicon dioxide 13 combined with a TEOS-ozone silicon dioxide layer. The said thermal silicon dioxide layer 13 is grown underneath the TEOS-ozone dioxide layer 11, as shown in FIG. 5.

The TEOS-ozone silicon dioxide liner is deposited, under following conditions: for sub-atmospheric pressure CVD in a single wafer chamber reactor P-5000 by Applied Materials Inc., at a temperature of 440° C., pressure 200–400 Torr, TEOS gas flow 600 mgm, ozone concentration in oxygen (in weight percent, %) about 12%, deposited to film thickness of between approximately 100 to 500 Angstroms. Trench sidewall oxidation underneath the TEOS-ozone silicon dioxide film is performed using the following specific conditions: 1050° C. in oxygen thermally grown to a thickness of approximately 30 to 150 Angstroms.

Some of the conventional processing, presented by way of comparison with the present invention methods, include a layer of silicon dioxide which is forming in the thickness range from about 0.5 to about 1.0 microns, by the following methods: a) TEOS LPCVD, tetra-ethyl-ortho-silicate, b) non-surface sensitive TEOS-ozone APCVD or SACVD processes 12, c) high-density plasma CVD (15), that are shown in FIG. 1c and FIG. 1d, respectively. Conventional LPCVD, low pressure TEOS (tetraethylorthosilicate) chemical vapor deposited silicon dioxide layer is performed in a vertical diffusion furnace in the following manner: temperature 670° C., pressure 0.5 Torr, TEOS gas flow 200 sccm, oxygen gas flow 5 sccm, deposition rate of approximately 30 Angstroms per minute.

For a conventional, non-surface sensitive, TEOS-ozone CVD film the following deposition conditions are employed using a P-5000 reactor by Applied Materials Inc.. These specific process conditions are for a sub-atmospheric (SACVD) deposition conditions: temperature at about 440° C., for a non-surface sensitive deposition process. For example, a two step deposition process is as follows: for the first step, pressure 60 Torr, TEOS flow about 500 mgm, ozone concentration in oxygen about 8% by weight, ozone/oxygen gas flow about 5,000 sccm, helium flow about 1,200 sccm; for the second step, process pressure about 500 Torr, TEOS gas flow about 550 mgm, helium flow about 4,000 sccm, the other parameters are the same as in the first step.

Another option to fill a trench is HDP-CVD, high-density plasma chemical vapor deposition using silane oxidation chemistry, which is performed specifically, in the following manner using a "Speed" reactor by Novellus Systems, Inc.: temperature 600° C., pressure about 4 milli-Torr, silane gas flow about 100 sccm, oxygen gas flow about 200 sccm, argon gas flow about 50 sccm, low frequency power about 4,000 Watts, high frequency power about 2,000 Watts.

The conventional densification process for trench fill films is as follows: elevated temperatures are used at about 1050° C. in nitrogen gas or oxygen gas ambient to finalize shallow trench fabrication. In addition, a routine conventional chemical mechanical polish (CMP) step is used, to provide a planarized surface to a trench isolation region.

However, with most of the aforementioned said conventional processing above, the stated conventional methods do not fill the trench completely. With most of the conventional method outlined above, defected areas are normally observed in scanning electron microscopic cross-sections of trench, depicted in FIG. 1c and FIG. 1d. As shown in FIG. 1c and FIG. 1d, voids formation 14 is common, as well as, the formation of seams 16, which are deleterious to the STI formation. These defect problems with STI formation are addressed and solved by the present invention.

The present invention starts shallow trench isolation (STI) using some of the conventional trench formation process, as provided and described above, shown in FIG. 1a as Prior Art. As described above, the trench formation is processed in the usual manner: using silicon thermal oxidation for pad silicon dioxide 4, low pressure CVD nitride deposition for nitride pad 6, photolithography and plasma etching for trench formation 8, all provided and shown in FIG. 1a.

The improved process of this present invention starts with a special lining of the trench, as shown in FIG. 3. A thin layer of TEOS-ozone silicon dioxide 11 is deposited by atmospheric or sub-atmospheric CVD process inside a trench 8, as shown in FIG. 3. The smooth contours of the TEOS-ozone silicon dioxide film 11, FIG. 3, are the result of several factors related to the film deposition conditions. As shown in FIG. 4a, which graphs the film deposition rate at specific sub-atmospheric pressure (SACVD) conditions versus the gas flow of TEOS, tetra-ethyl-ortho-silicate. The preferred deposition conditions for good trench fill TEOS films are performed at the maximum difference in the rate of film deposition on silicon (upper curve), as compared to, the film deposition on silicon nitride (lower curve). The preferred TEOS-ozone silicon dioxide film properties that are achieved, are listed in FIG. 4b. Low TEOS-ozone film roughness, low film WERR, wet etch rate ratio (as referred to that of thermal silicon dioxide), and low film shrinkage of films deposited directly on silicon are achieved, as compared to, TEOS-ozone films deposited directly on silicon nitride. Growth characteristics (FIG. 6) of the TEOS-ozone film 11 are superior and are normally characterized as a "flow-like" film 17 deposition. This effect can be seen in FIG. 6, where film thickness in the bottom corner of the structure is higher than that of top or flat surfaces of structures. The special conditions of TEOS-ozone deposition included: film thickness is approximately from 100 to 500 Angstroms, deposition rate is approximately 900 Angstroms per minute or higher on a silicon surface, ratio of deposition rates on silicon versus that on silicon nitride is approximately 2 to 1 or higher.

The next step in the process of this invention is the growth of thin thermal silicon dioxide layer 13, which is grown through the smooth TEOS-ozone oxide layer 11 and forms underneath the TEOS ozone layer, as sketched in FIG. 5. The step that follows, in the process sequence, is the trench filling process, which can be realized as: conventional TEOS-based LPCVD, or non-surface sensitive TEOS-ozone APCVD or SACVD, or HDP-CVD. Finally in the process, all the layers are annealed at elevated temperatures with the end result being that the trench filling dielectric materials are densified, eventually to form void-free trenches for sub-quarter micron technology. This is shown in FIG. 7a for LPCVD TEOS silicon dioxide or TEOS-ozone CVD silicon dioxide (12), and in FIG. 7b for HDP-CVD silicon dioxide (15).

While the invention has been particularly shown and described with reference to the preferred embodiments thereof, it will be understood by those skilled in the art that various changes in form and details may be made without departing from the spirit and scope of the invention.

What is claimed is:

1. A method of fabricating shallow trenches in the manufacture of semiconductor devices with sub-quarter micron technology, whereby the shallow trench is filled by the method comprising:

providing a silicon substrate, the silicon having a trench formed therein;

forming a special trench liner layer of silicon dioxide film by deposition through the chemical vapor deposition method employing tetraethylorthosilicate silicon source material and ozone (TEOS-ozone);

oxidizing thermally the silicon substrate to form within the trench a thermal silicon dioxide layer underneath the smooth TEOS-ozone trench liner layer;

depositing an enhanced high density plasma chemical vapor deposition (CVD) silicon dioxide layer over said special trench liner layer of silicon dioxide film;

annealing all layers thermally at elevated temperatures, about 1050° C. in nitrogen or oxygen gas ambient for densification;

planarizing the excess trench fill material by chemical mechanical polishing (CMP) to form a planar surface on the silicon substrate.

2. The method of claim 1, wherein the TEOS-ozone chemically vapor deposited trench silicon dioxide liner is formed from a tetraethylorthosilicate (TEOS) silicon source material under the following conditions, providing approximately two, or higher, to one ratio of film deposition rate on silicon surface versus the deposition rate on silicon nitride surface.

3. The method on claim 1, wherein the trench silicon dioxide liner layer formed through TEOS-ozone chemical vapor deposition has the following properties on a silicon surface as compared to the silicon nitride surface: higher film density (lower etch rate), lower film shrinkage, and diminished surface roughness.

4. The method of claim 1, wherein the TEOS-ozone chemically vapor deposited trench silicon dioxide liner is formed to a film thickness about 100 to 500 Angstroms, deposition rate of approximately 900 Angstroms per minute on silicon, sub-atmospheric pressures of 200 to 400 Torr, TEOS flow of about 500 (mgm), ozone concentration in oxygen approximately 12 weight percent, characterized as a "flow-like" film deposition.

5. The method of claim 1, wherein the thermal oxide layer grown underneath the TEOS-ozone silicon dioxide liner layer is the following thickness: from about 30 to 150 Angstroms, thermally grown in oxygen at 1050° C., oxidizing through the TEOS-ozone silicon dioxide liner layer.

6. The method of claim 1, wherein the silicon substrate is a semiconductor substrate and the trench is an isolation trench within the silicon semiconductor substrate.

7. The method of claim 1, wherein the width of the trench is equal to or greater than 0.25 microns and the depth of the trench is from about 0.3 to about 0.6 microns, and can be deeper for high aspect ratio trenches.

8. The method of claim 1, wherein the silicon dioxide layer on top of TEOS-ozone silicon dioxide liner layer is the following thickness: from about 0.5 microns to about 1.0 microns.

9. The method of claim 1, wherein the silicon dioxide layer on top of TEOS-ozone silicon dioxide liner layer is deposited by employing tetraethylorthosilicate silicon source material and ozone (TEOS-ozone).

10. The method of claim 1, wherein the silicon dioxide layer on top of TEOS-ozone silicon dioxide liner layer is deposited by employing tetraethylorthosilicate silicon source material and oxygen at low pressure.

11. The method of claim 1, wherein the silicon dioxide layer on top of TEOS-ozone silicon dioxide liner layer is deposited by employing silane silicon source material at high density plasma chemical vapor deposition (HDP-CVD) conditions.

* * * * *